US011087812B1

(12) United States Patent
Lee et al.

(10) Patent No.: US 11,087,812 B1
(45) Date of Patent: Aug. 10, 2021

(54) MAGNETORESISTIVE RANDOM-ACCESS MEMORY

(71) Applicant: UNITED MICROELECTRONICS CORP., Hsin-Chu (TW)

(72) Inventors: Yi-Hui Lee, Taipei (TW); I-Ming Tseng, Kaohsiung (TW); Chiu-Jung Chiu, Tainan (TW); Chung-Liang Chu, Kaohsiung (TW); Yu-Chun Chen, Kaohsiung (TW); Ya-Sheng Feng, Tainan (TW); Yi-An Shih, Changhua County (TW); Hsiu-Hao Hu, Keelung (TW); Yu-Ping Wang, Hsinchu (TW)

(73) Assignee: UNITED MICROELECTRONICS CORP., Hsin-Chu (TW)

( * ) Notice: Subject to any disclaimer, the term of this patent is extended or adjusted under 35 U.S.C. 154(b) by 0 days.

(21) Appl. No.: 16/931,438

(22) Filed: Jul. 16, 2020

(30) Foreign Application Priority Data

Jun. 16, 2020 (CN) .......................... 202010548682.5

(51) Int. Cl.
*G11C 16/08* (2006.01)
*G11C 11/16* (2006.01)

(52) U.S. Cl.
CPC ...... *G11C 11/1659* (2013.01); *G11C 11/1655* (2013.01); *G11C 11/1657* (2013.01); *G11C 11/1675* (2013.01); *G11C 11/1697* (2013.01)

(58) Field of Classification Search
CPC .................................................... G11C 11/161
USPC ......................................................... 365/158
See application file for complete search history.

(56) References Cited

U.S. PATENT DOCUMENTS

| 8,902,641 | B2 | 12/2014 | Chih | |
|---|---|---|---|---|
| 9,007,819 | B2 * | 4/2015 | Ahn | G11C 11/1675 365/158 |
| 2020/0098427 | A1 * | 3/2020 | Lee | G11C 13/0026 |
| 2021/0005237 | A1 * | 1/2021 | Gupta | G11C 11/161 |
| 2021/0066583 | A1 * | 3/2021 | Park | H01L 45/08 |

* cited by examiner

*Primary Examiner* — Min Huang
(74) *Attorney, Agent, or Firm* — Winston Hsu

(57) ABSTRACT

A MRAM includes a plurality of memory cells, an operation unit, a voltage generator, and an input/output circuit. The operation unit includes multiple groups of memory cells among the plurality of memory cells. The voltage generator is configured to provide a plurality of control signals by voltage-dividing a voltage control signal and selectively output the plurality of control signals to the input/output circuit. The input/output circuit is configured to output a plurality of switching pulse signals to the multiple groups of memory cells according to the plurality of control signals, wherein each switching pulse signal differs in pulse width or level.

9 Claims, 12 Drawing Sheets

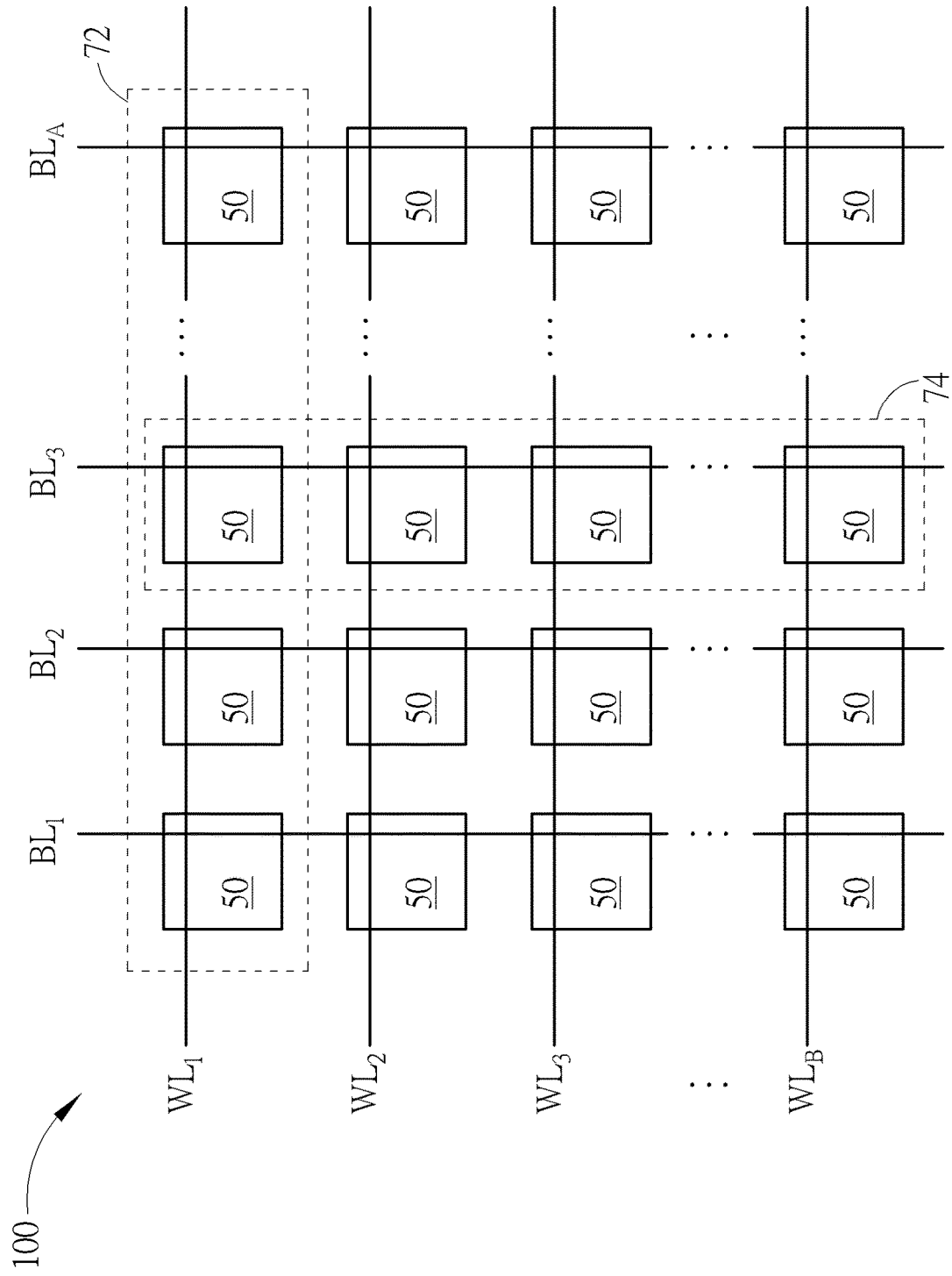

MAGNETORESISTIVE RANDOM-ACCESS MEMORY

CROSS REFERENCE TO RELATED APPLICATION

This application claims priority of China Application No. 202010548682.5 filed on 2020 Jun. 16.

BACKGROUND OF THE INVENTION

1. Field of the Invention

The present invention is related to a magnetoresistive random-access memory, and more particularly, to a magnetoresistive random-access memory capable of ensuring data accuracy of write operation.

2. Description of the Prior Art

Traditional memory normally stores data by charging/discharging capacitors, while magnetoresistive random-access memory (MRAM) stores data in magnetic domains. MRAM is characterized in high-speed data transmission, high cell density, light weight, low power consumption and high impact resistance, and thus particularly suitable for implementing on high-end portable electronic products.

FIG. 1 is a diagram illustrating a prior art MRAM array using a spin-torque-transfer (STT) technique. Each MRAM cell in the prior art MRAM array includes a select transistor 12 and a magnetic tunnel junction (MTJ) transistor 14, wherein the control end of the select transistor 12 is coupled to a corresponding word line WL, and the MTJ transistor 14 is coupled between the first end of the select transistor 12 and a corresponding bit line BL. Each MTJ transistor includes a data magnetic layer and a reference magnetic layer. During a write operation, an appropriate switching pulse signal may be applied via a corresponding bit line for changing the magnetization direction of the data magnetic layer. Therefore, the resistance of the MTJ transistor 14 may be adjusted to be associated with a logic "0" or a logic "1" state so that data may be written therein.

Due to variations in manufacturing process or material, different MTJ transistors in an MRAM array may have different switching characteristics from each other and thus require different switching pulse signals for successfully reversing the magnetization direction of data magnetic layers. Itis assumed that a first switching pulse signal required to change the state of a first MTJ transistor is stronger than a second switching pulse signal required to change the state of a second MTJ transistor. After applying the first switching pulse to the MRAM array, the first MTJ transistor can be aligned to its desired magnetization direction. However, the first switching pulse is excessive to the second MTJ transistor and may cause Joules heating which prevents the second MTJ transistor from being aligned to its desired magnetization direction. The above-mentioned "back-hopping" phenomenon may downgrade the data accuracy when writing data into the MRAM cells.

SUMMARY OF THE INVENTION

The present invention provides a magnetoresistive random-access memory which includes a memory array, an operation unit, a voltage generator, and an input/output circuit. The memory array includes a plurality of memory cells. The operation unit includes a first group to an $N^{th}$ groups of memory cells among the plurality of memory cells, wherein N is an integer larger than 1. The voltage generator includes an input end for receiving a voltage control signal, a first to an $N^{th}$ output ends, a voltage-dividing circuit configured to provide the plurality of control signals by voltage-dividing the voltage control signal, a first to an $N^{th}$ switches configured to selectively couple a first to an $N^{th}$ control signals among the plurality of control signals to the first to the $N^{th}$ output ends. The input/output circuit is coupled to the first to an $N^{th}$ output ends and configured to output a first to an $N^{th}$ switching pulse signals to the first to the $N^{th}$ groups of memory cell in the operation unit when receiving the first to the $N^{th}$ control signals, respectively, wherein the first to the $N^{th}$ switching pulse signals differ from each other in a pulse width or a level.

These and other objectives of the present invention will no doubt become obvious to those of ordinary skill in the art after reading the following detailed description of the preferred embodiment that is illustrated in the various figures and drawings.

BRIEF DESCRIPTION OF THE DRAWINGS

FIG. 3 is a diagram illustrating an MRAM array in an STT MRAM device according to an embodiment of the present invention.

DETAILED DESCRIPTION

Figure 2:
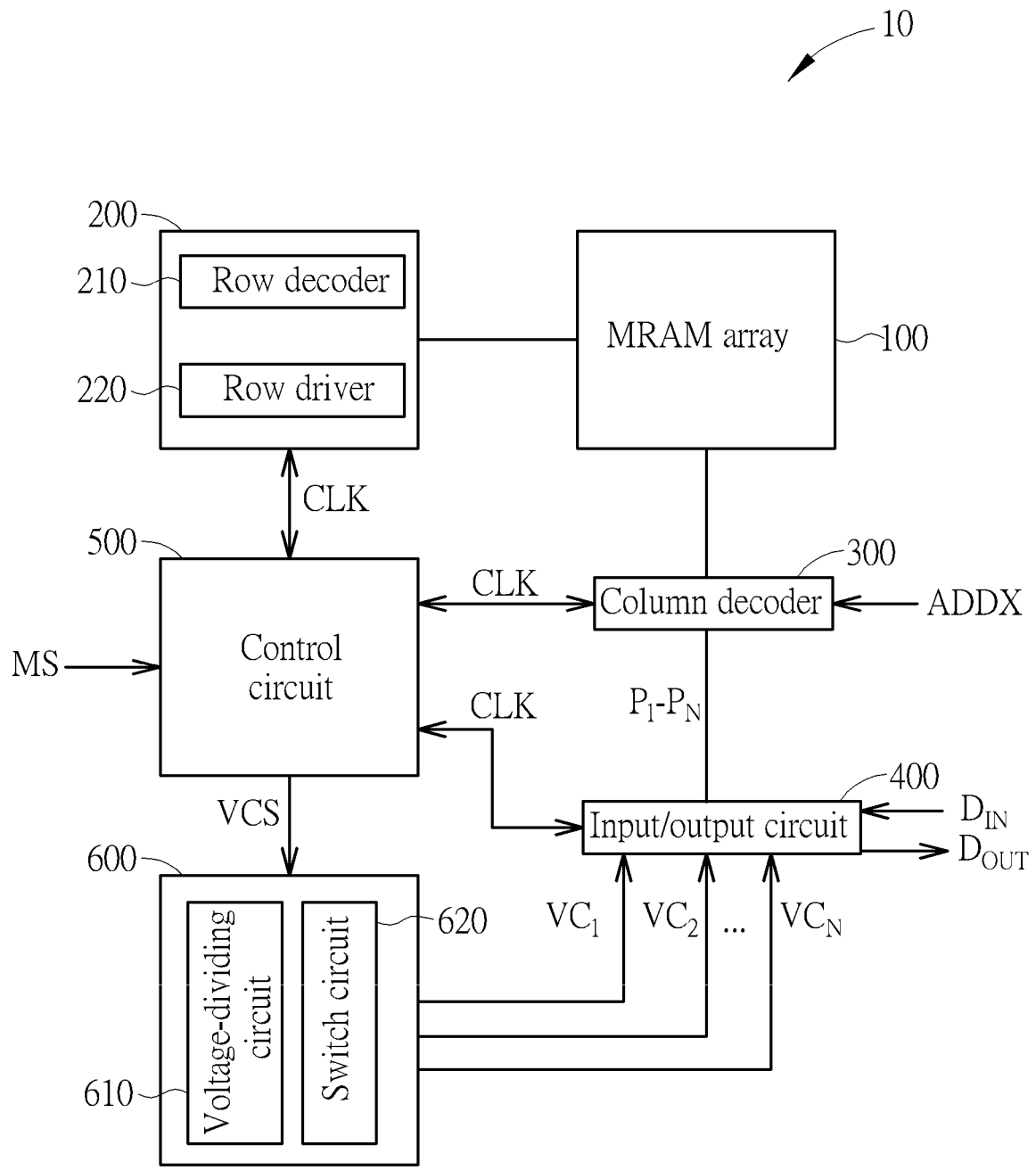
FIG. 2 is a functional diagram illustrating an STT MRAM device according to an embodiment of the present invention.

FIG. 2 is a functional diagram illustrating an STT MRAM device 10 according to an embodiment of the present invention. The STT MRAM device 10 includes an MRAM array 100, a row select circuit 200, a column decoder 300, an input/output circuit 400, a control circuit 500, and a voltage generator 600.

Figure 1:
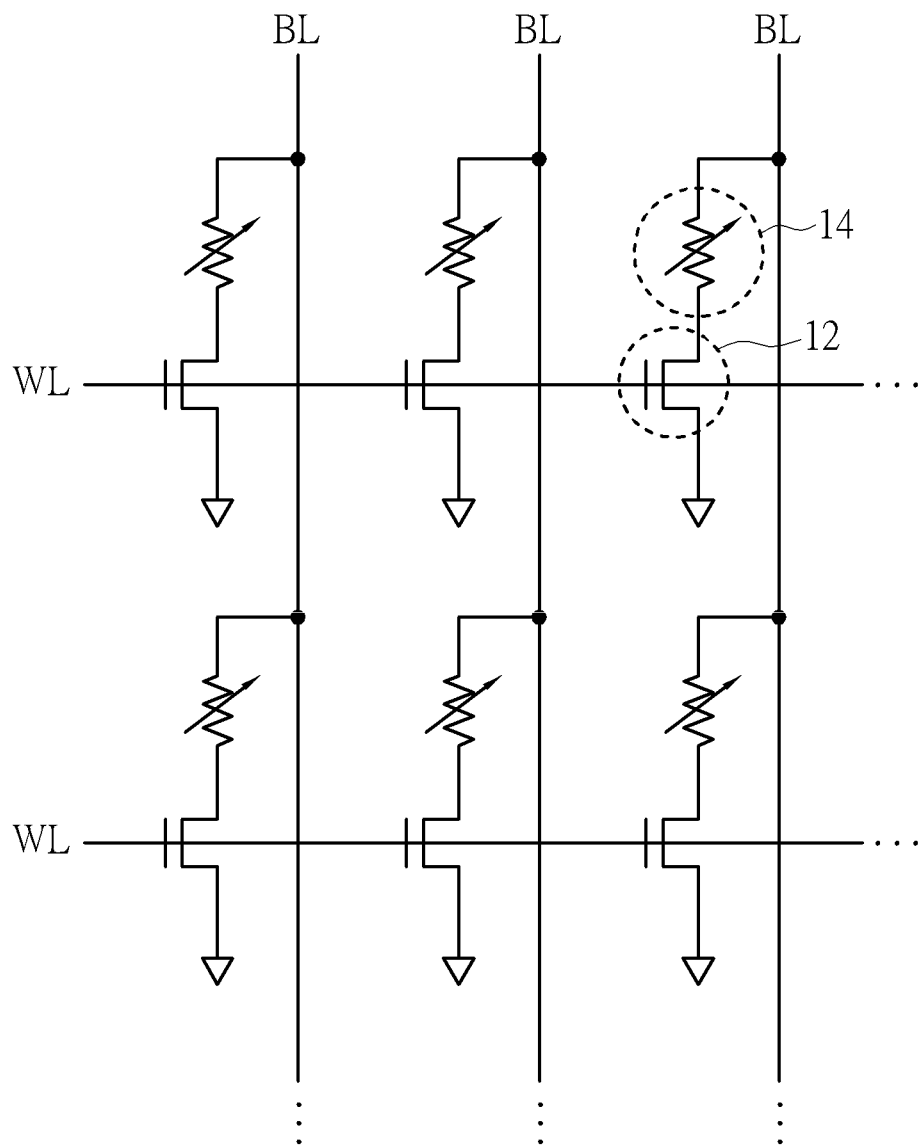
FIG. 1 is a diagram illustrating a prior art STT MRAM array.

FIG. 3 is a diagram illustrating the MRAM array 100 in the STT MRAM device 10 according to an embodiment of the present invention. The MRAM array 100 includes a plurality of MRAM cells 50 coupled to the column select circuit 300 via a plurality of bit lines $BL_1$~$BL_A$ and coupled to the row select circuit 200 via a plurality of word lines $WL_1$~$WL_B$, wherein A and B are integers larger than 1. Each MRAM cell 50 include a select transistor and an MTJ transistor as depicted in FIG. 1 (not shown in FIG. 3) and is disposed at the intersection of a corresponding bit line and a corresponding word line. Each word line is coupled to the select transistors of the "A" MRAM cells 50 on a corresponding row, while each bit line is coupled to the MJT transistors of the "B" MRAM cells 50 on a corresponding column. During a write operation, the select transistor of a selected MRAM cell 50 may be turned on by its corresponding word line so that data may be written into the MTJ transistor of the selected MRAM cell 50 via its corresponding bit line.

In the present invention, data may be simultaneously written into multiple MRAM cells 50 defined by an operation unit. In an embodiment, each operation unit may include "A" MRAM cells 50 coupled to the same word line, such as an operation unit 72 depicted in FIG. 3. In another embodiment, each operation unit may include "B" MRAM cells 50 coupled to the same bit line, such as an operation unit 74 depicted in FIG. 3. In another embodiment, each operation unit may include "a*b" MRAM cells 50 coupled to "a" consecutive bit lines among the "A" bit lines and "b" consecutive word lines among the "B" word lines, wherein "a" is an integer between 1 and "A", and "b" is an integer between 1 and "B". However, the definition of each operation unit does not limit the scope of the present invention.

The row select circuit 200 includes a row decoder 210 and a row driver 220. The row decoder 210 is configured to select a word line to perform write or read operation. The driver 220 is configured to apply appropriate voltages to selected or unselected word lines, thereby turning on the select transistor coupled to the selected word lines and turning off the select transistor coupled to the unselected word lines.

The input/output circuit 400 may include a sense amplifier and a write-in driver (not shown) for writing data $D_{IN}$ into the MRAM array 100 or reading data $D_{OUT}$ from the MRAM array 100. The input/output circuit 400 is configured to provide "N" switching pulse signals $P_1$~$P_N$ to the MRAM array 100 according to "N" control signals $VC_1$~$VC_N$, wherein "N" is an integer larger than 1 and the "N" switching pulse signals $P_1$~$P_N$ differ from each other in pulse width or in level. The column decoder 300 is configured to select a bit line to perform write or read operation according to an address signal ADDX, thereby supply a corresponding switching pulse signal among the switching pulse signals $P_1$~$P_N$ to specific MRAM cells in each operation unit.

Figure 4B:
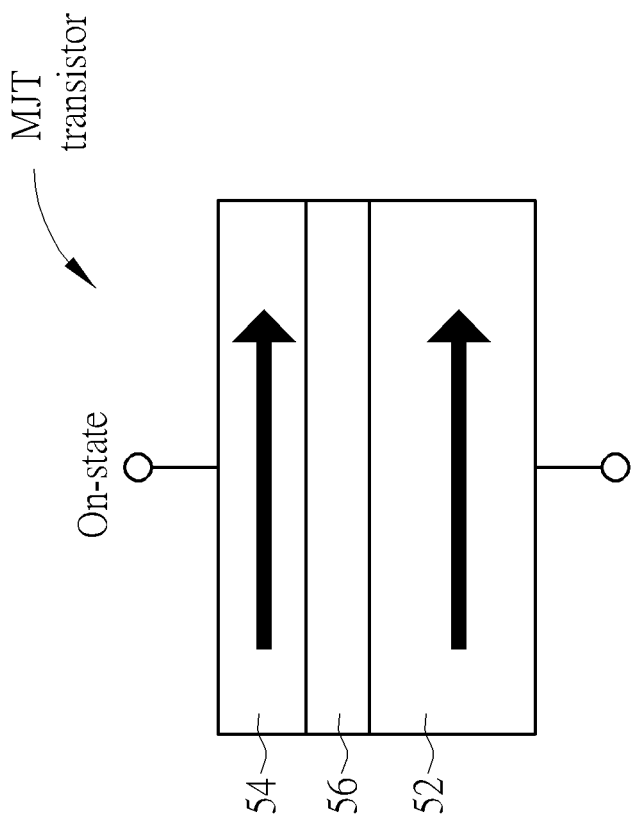
FIG. 4B is a diagram illustrating an implementation and data status of an MJT transistor in each MRAM cell according to another embodiment of the present invention.
Figure 4A:
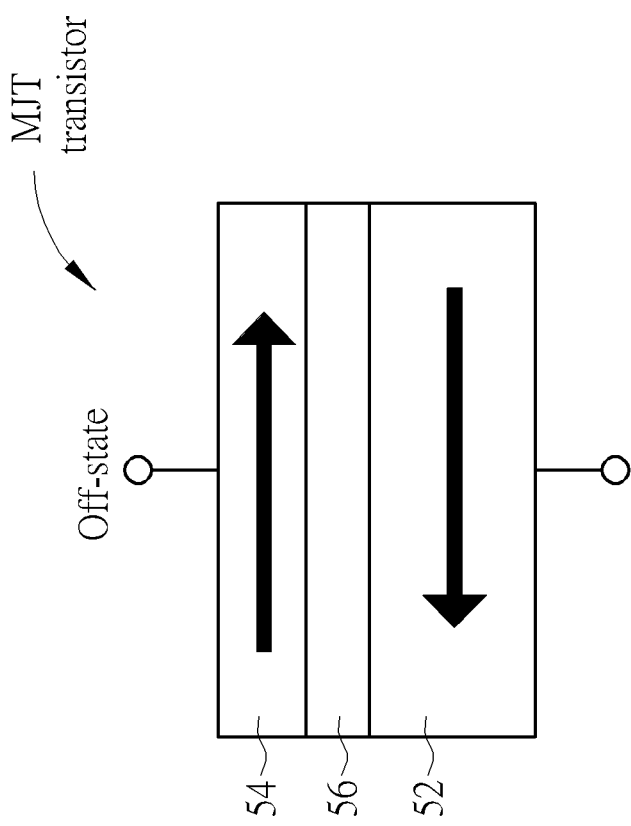
FIG. 4A is a diagram illustrating an implementation and data status of an MJT transistor in each MRAM cell according to an embodiment of the present invention.

FIGS. 4A and 4B are diagrams illustrating the implementation and data status of the MJT transistor in each MRAM cell 50 according to embodiments of the present invention. The MJT transistor includes a data magnetic layer 52, a reference magnetic layer 54, and a tunnel barrier layer 56, wherein the magnetization direction of the data magnetic layer 52 and the reference magnetic layer 54 are represented by arrow symbols. The magnetization direction of the data magnetic layer 52 varies with externally applied magnetic field and may switch between two magnetic states, thereby storing bit information. The reference magnetic layer 54 is made of magnetic material with a fixed magnetic state, and its magnetization direction is unaffected by externally applied magnetic field. The resistance of the tunnel barrier layer 56 is determined by the relationship between the magnetization directions of the data magnetic layer 52 and the reference magnetic layer 54. When the magnetization direction of the data magnetic layer 52 is aligned in an anti-parallel direction with respect to the magnetization direction of the reference magnetic layer 54 after applying a switching pulse signal to the MTJ transistor, the tunnel barrier layer 56 is in a high-resistance state, thereby putting the MTJ transistor in an off-state as depicted in FIG. 4A. When the magnetization direction of the data magnetic layer 52 is aligned in a parallel direction with respect to the magnetization direction of the reference magnetic layer 54 after applying a switching pulse signal to the MTJ transistor, the tunnel barrier layer 56 is in a low-resistance state, thereby putting the MTJ transistor in an on-state as depicted in FIG. 4B.

The data stored in an MRAM cell is defined by the state of its MTJ transistor. In an embodiment, an MRAM cell 50 is considered to store logic "1" data when its MTJ transistor is in the off-state and is considered to store logic "0" data when its MTJ transistor is in the on-state. In another embodiment, an MRAM cell 50 is considered to store logic "0" data when its MTJ transistor is in the off-state and is considered to store logic "1" data when its MTJ transistor is in the on-state. However, the definition of the data stored in an MRAM cell with respect to the state of its MTJ transistor does not limit the scope of the present invention.

Due to variations in manufacturing process or material, the MTJ transistors in different MRAM cells may have different switching characteristics from each other and thus require different switching pulse signals for successfully reversing the magnetization direction of the data magnetic layers 52, thereby switching between the on-state and the off-state. As previously stated, the use of fixed switching pulse signals may result in the undesirable back-hopping phenomenon which downgrades data accuracy of write operation. Therefore, the input/output circuit 400 is configured to provide "N" switching pulse signals $P_1$~$P_N$ to the MRAM array 100 according to "N" control signals $VC_1$~$VC_N$, wherein the switching pulse signals $P_1$~$P_N$ differ from each other in pulse width or in level.

Figure 5:
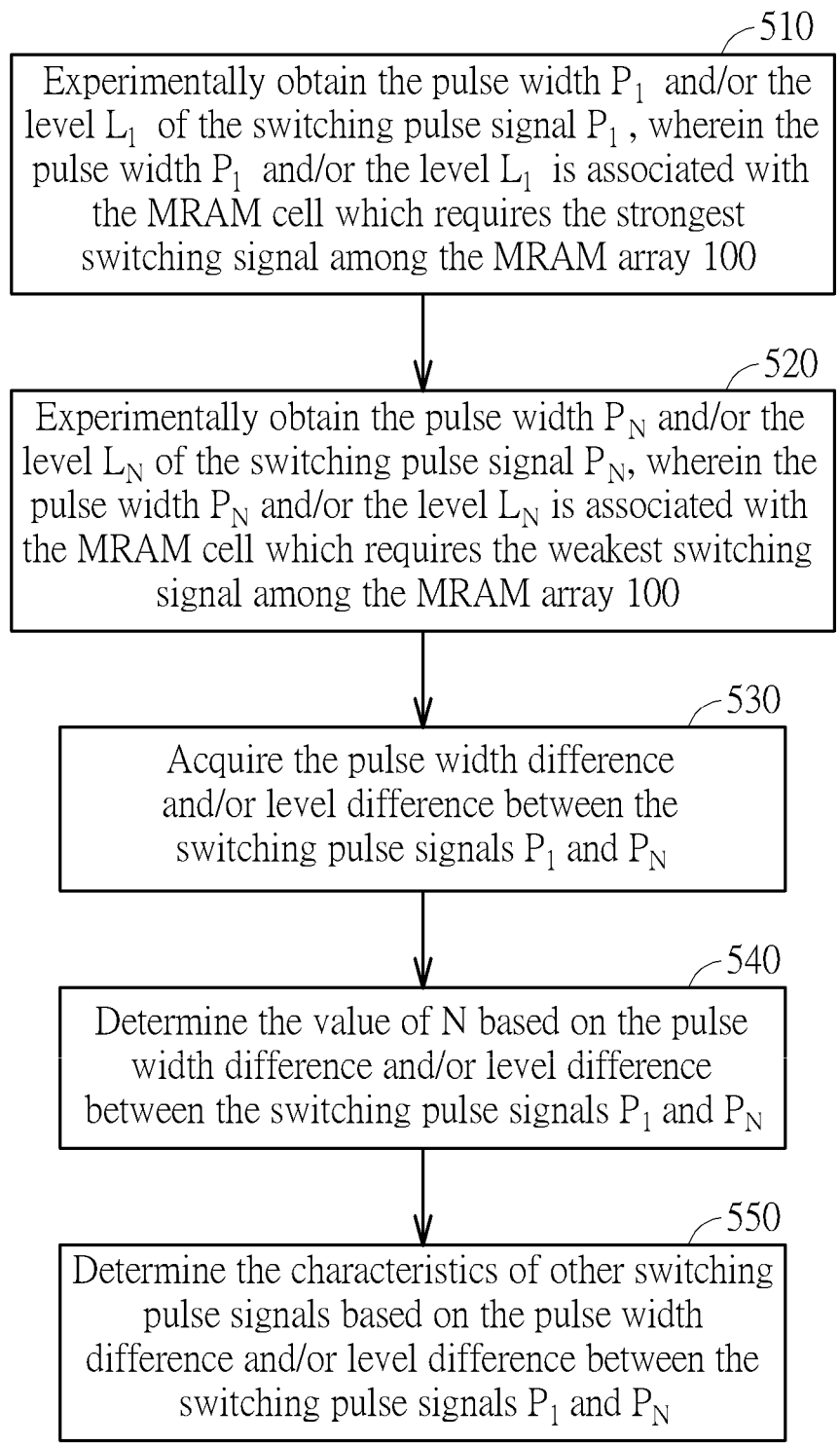
FIG. 5 is a flowchart illustrating a method of determining the pulse widths and the levels of the switching pulse signals according to an embodiment of the present invention.

FIG. 5 is a flowchart illustrating a method of determining the pulse widths and the levels of the switching pulse signals $P_1$~$P_N$ according to an embodiment of the present invention. The flowchart in FIG. 5 includes the following steps:

Step 510: experimentally obtain the pulse width $P_1$ and/or the level $L_1$ of the switching pulse signal $P_1$, wherein the pulse width $P_1$ and/or the level $L_1$ is associated with the MRAM cell which requires the strongest switching signal among the MRAM array 100.

Step 520: experimentally obtain the pulse width $P_N$ and/or the level $L_N$ of the switching pulse signal $P_N$, wherein the pulse width $P_N$ and/or the level $L_N$ is associated with the MRAM cell which requires the weakest switching signal among the MRAM array 100.

Step 530: acquire the pulse width difference and/or level difference between the switching pulse signals $P_1$ and $P_N$.

Step 540: determine the value of "N" based on the pulse width difference and/or level difference between the switching pulse signals $P_1$ and $P_N$.

Step 554: determine the characteristics of other switching pulse signals based on the pulse width difference and/or level difference between the switching pulse signals $P_1$ and $P_N$.

Figure 6A:
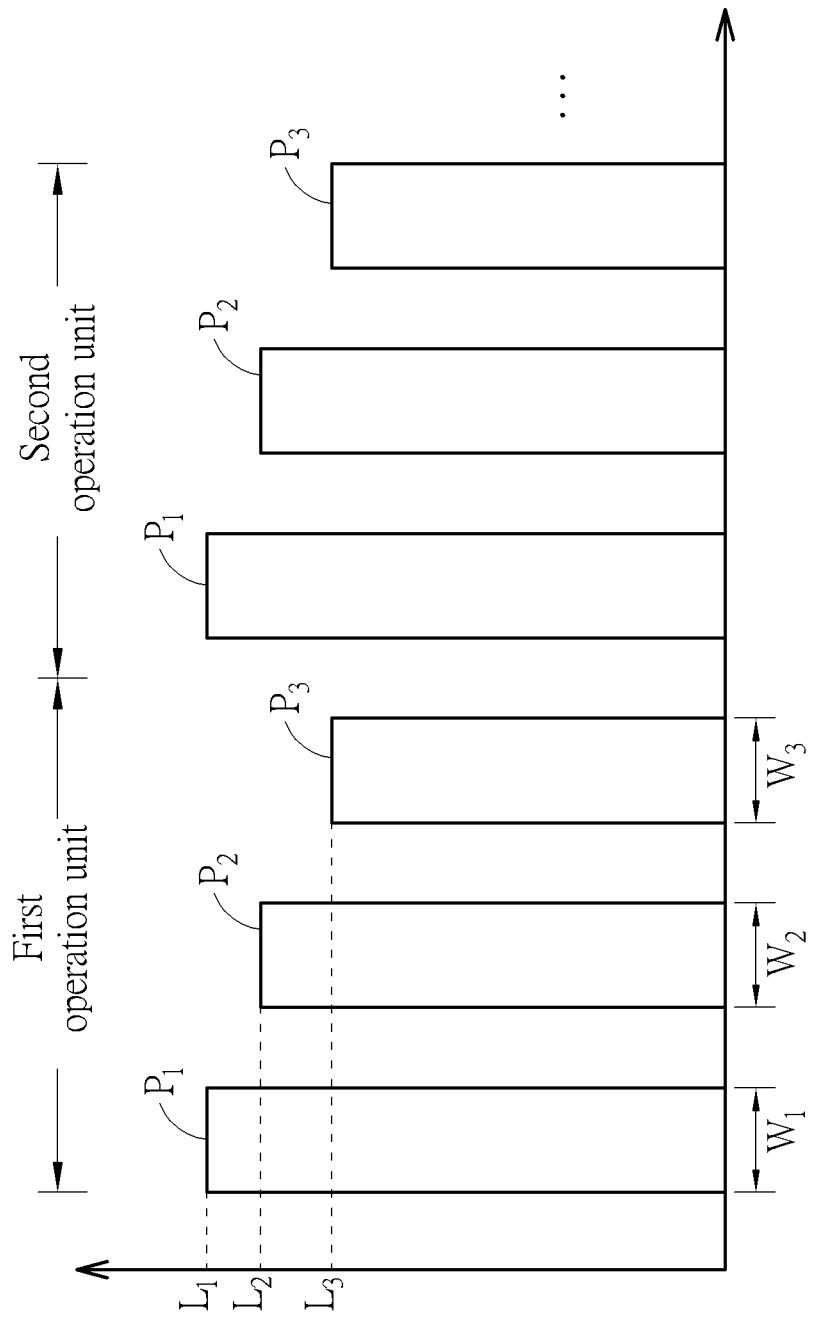
FIG. 6A is a diagram illustrating the switching pulse signals applied to an MRAM cell according to an embodiment of the present invention.
Figure 6B:
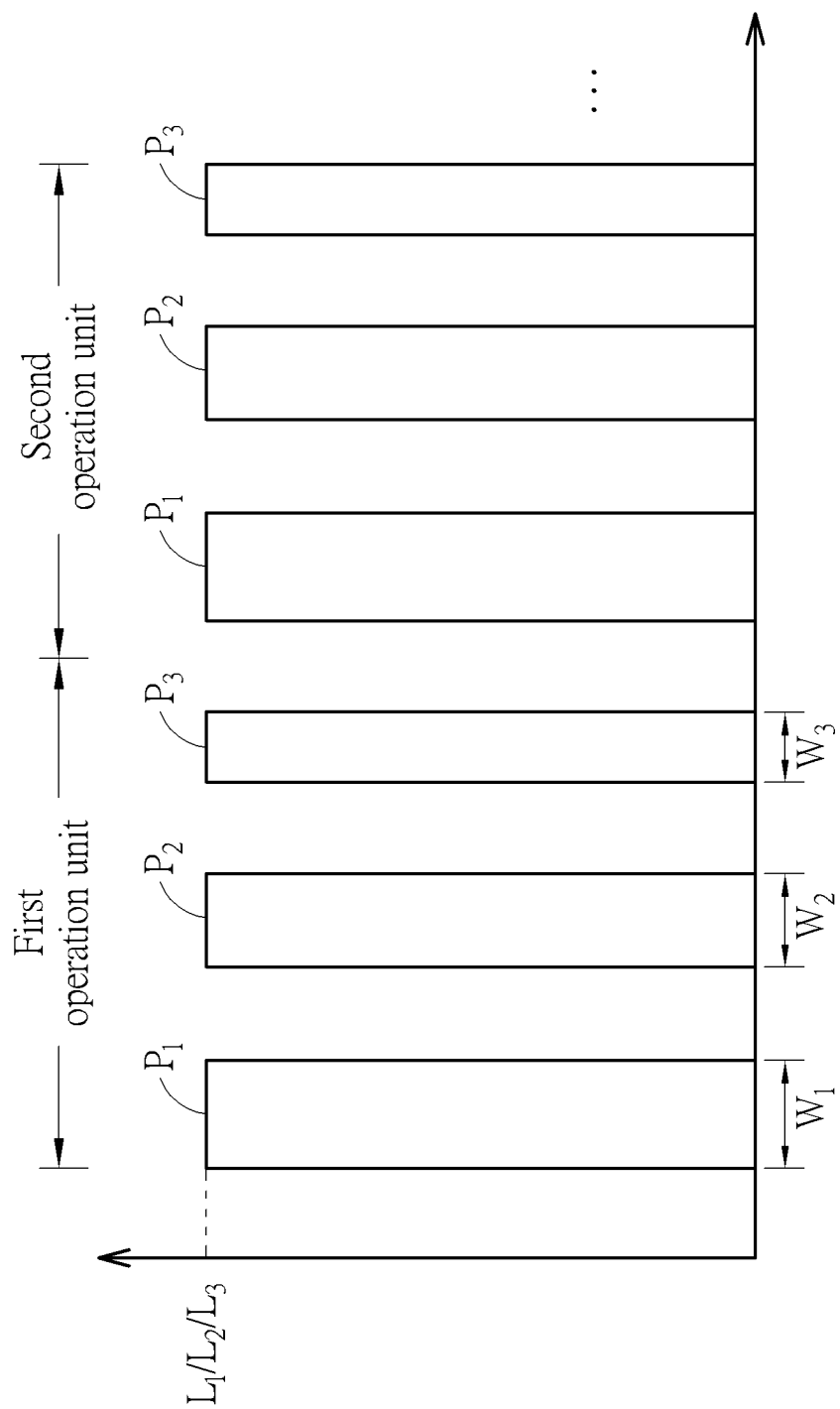
FIG. 6B is a diagram illustrating the switching pulse signals applied to an MRAM cell according to another embodiment of the present invention.
Figure 6C:
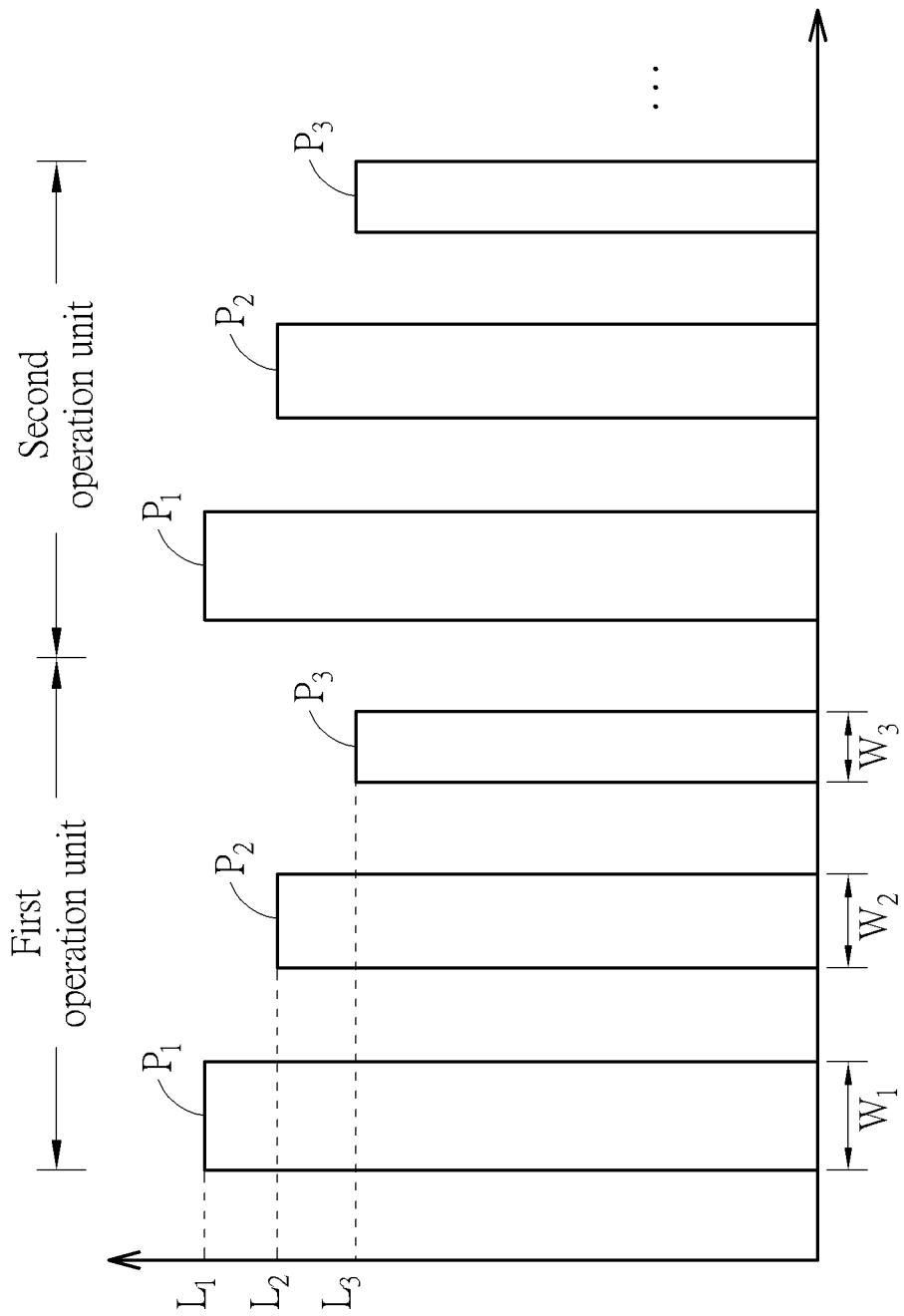
FIG. 6C is a diagram illustrating the switching pulse signals applied to an MRAM cell according to another embodiment of the present invention.

FIGS. 6A-6C are diagrams illustrating the switching pulse signals applied to the MRAM cell according to embodiments of the present invention. For illustrative purpose, FIGS. 6A-6C depict the embodiment of N=3. In other words, after executing the method depicted in FIG. 5, it is determined that the MRAM cells in the MRAM array 100 exhibit three different switching characteristics.

In the embodiment depicted in FIG. 6A, the switching pulse signals $P_1 \sim P_3$ have a fixed pulse width but decreasing levels ($W_1 = W_2 = W_3$ and $L_1 > L_2 > L_3$). In the embodiment depicted in FIG. 6B, the switching pulse signals $P_1 \sim P_3$ have a fixed level but decreasing pulse widths ($W_1 > W_2 > W_3$ and $L_1 = L_2 = L_3$). In the embodiment depicted in FIG. 6C, the switching pulse signals $P_1 \sim P_3$ have decreasing pulse widths and decreasing levels ($W_1 > W_2 > W_3$ and $L_1 > L_2 > L_3$).

Figure 7A:
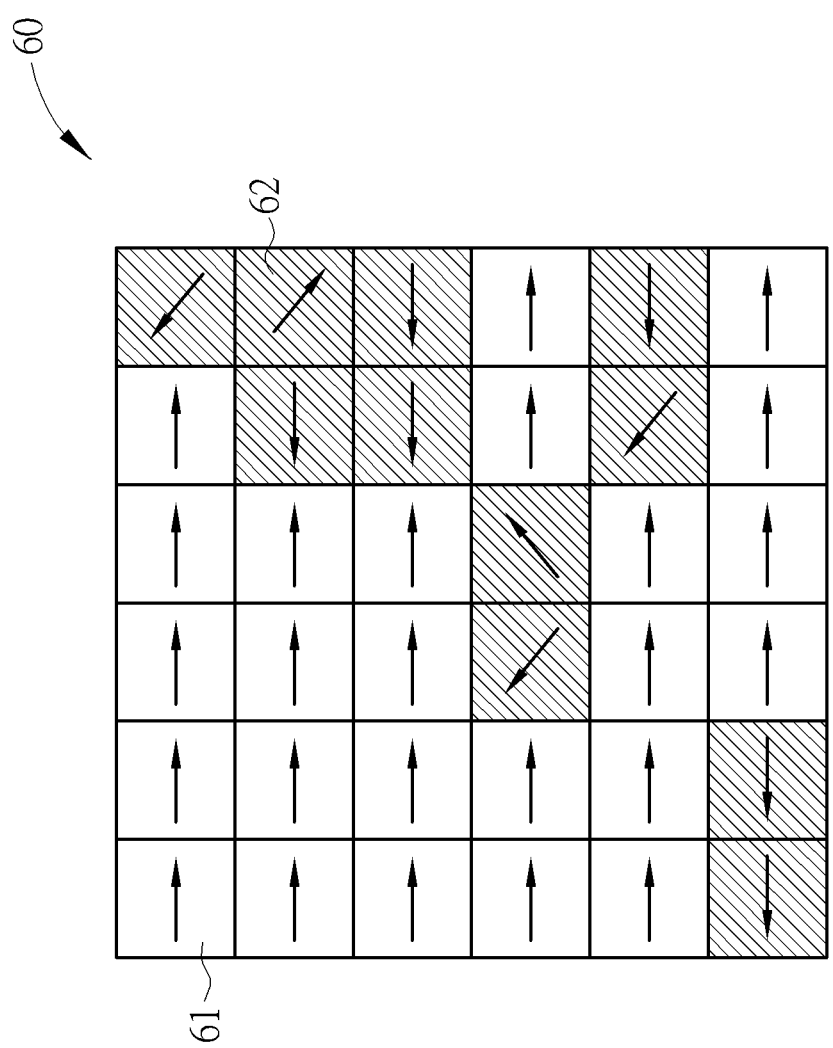
FIG. 7A is a diagram illustrating the magnetization direction of the data magnetic layer of the MTJ transistor in each MRAM cell when applying switching pulse signals to the MRAM array according to an embodiment of the present invention.
Figure 7B:
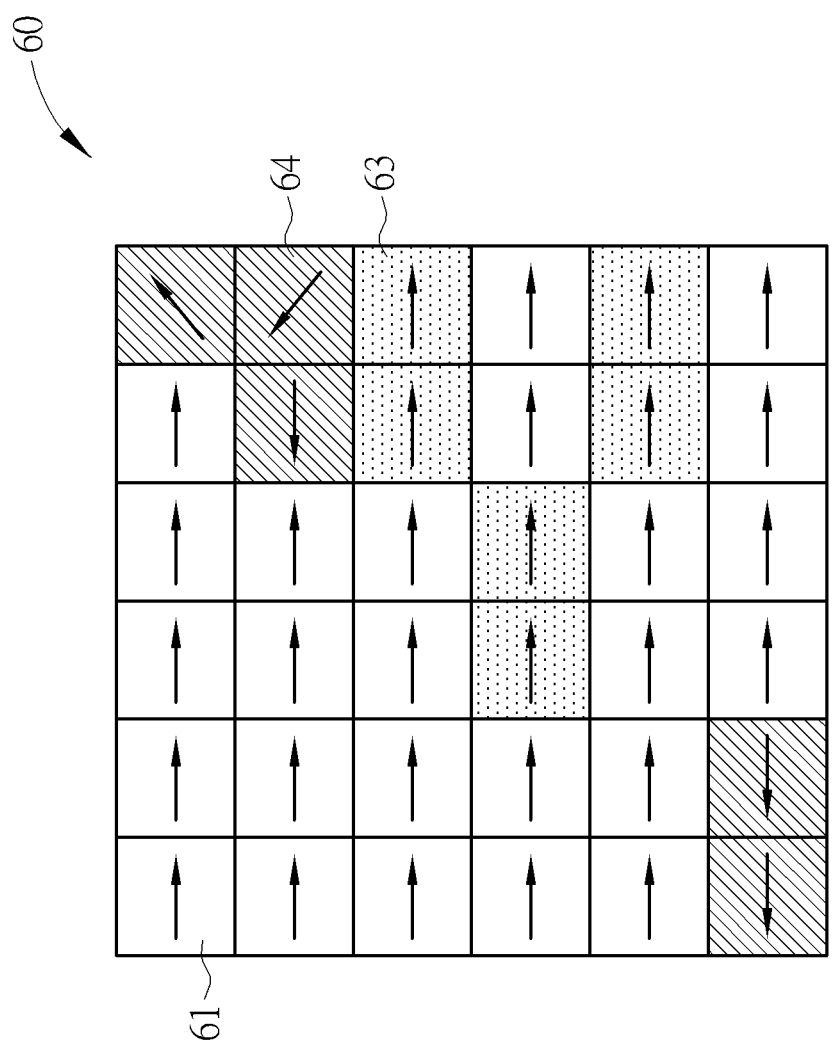
FIG. 7B is a diagram illustrating the magnetization direction of the data magnetic layer of the MTJ transistor in each MRAM cell when applying switching pulse signals to the MRAM array according to another embodiment of the present invention.
Figure 7C:
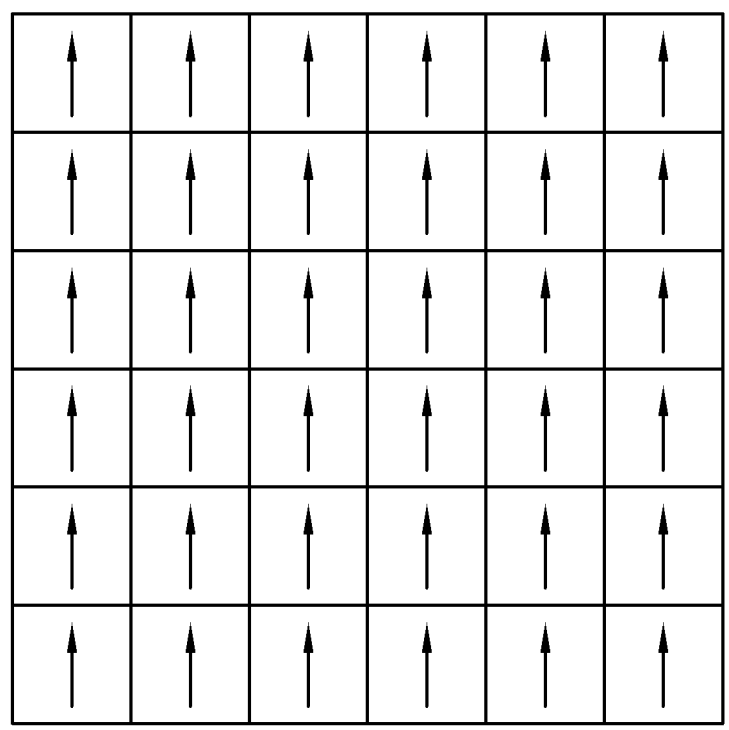
FIG. 7C is a diagram illustrating the magnetization direction of the data magnetic layer of the MTJ transistor in each MRAM cell when applying switching pulse signals to the MRAM array according to another embodiment of the present invention.

FIGS. 7A~7C are diagrams illustrating the magnetization direction of the data magnetic layer of the MTJ transistor in each MRAM cell 50 when applying the switching pulse signals $P_1 \sim P_N$ to the MRAM array 100 according to embodiments of the present invention. For illustrative purpose, it is assumed that data is simultaneously written into an operation unit 60 having 6×6 MRAM units during each write operation, and that the MRAM cells in the MRAM array 100 exhibit three different switching characteristics. In other words, the input/output circuit 400 provide three switching pulse signals $P_1 \sim P_3$, as depicted in FIGS. 6A~6C.

In the present invention, the input/output circuit 400 is configured to sequentially provide the switching pulse signal $P_1$ to the first group of MRAM cells in the operation unit 60, provide the switching pulse signal $P_2$ to the second group of MRAM cells in the operation unit 60, and provide the switching pulse signal $P_3$ to the third group of MRAM cells in the operation unit 60 via the column decoder 300, wherein the first group of MRAM cells includes all MRAM cells in the operation unit 60, the size of the second group of MRAM cells does not exceed the size of the first group of MRAM cells, and the size of the third group of MRAM cells does not exceed the size of the second group of MRAM cells.

After the input/output circuit 400 provides the switching pulse signal $P_1$ to the first group of MRAM cells in the operation unit 60 via the column decoder 300, the magnetization direction (indicated by arrow symbols) of the MTJ transistor in each MRAM cell is depicted in FIG. 7A. Since the pulse width and/or the level of the switching pulse signal $P_1$ is associated with the MRAM cells (each designated by a blank square and a numeral 61) which require the strongest switching signal among the MRAM array 100, the MTJ transistor in each of the above-mentioned MRAM cells 61 can be aligned to a desired magnetization direction (such as horizontally towards right), while the MTJ transistors in other MRAM cells (each designated by a striped square and a numeral 62) which require less strong switching signal among the MRAM array 100 may not be aligned to the desired magnetization direction due to back-hopping phenomenon. Under such circumstance, in the next step of the write operation, the input/output circuit 400 is configured to provide the switching pulse signal $P_2$ only to the second group of MRAM cells (the MRAM cells 62), but not to the MRAM cells 61 with proper magnetization direction in the operation unit 60.

After the input/output circuit 400 provides the switching pulse signal $P_2$ to the second group of MRAM cells in the operation unit 60 via the column decoder 300, the magnetization direction (indicated by arrow symbols) of the MTJ transistor in each MRAM cell is depicted in FIG. 7B. Since the pulse width and/or the level of the switching pulse signal $P_2$ is associated with the MRAM cells (each designated by a doted square and a numeral 63) which require the second strongest switching signal among the MRAM array 100, the MTJ transistor in each of the above-mentioned MRAM cells 63 can be aligned to a desired magnetization direction (such as horizontally towards right), while the MTJ transistors in other MRAM cells (each designated by a striped square and a numeral 64) which require less strong switching signal among the MRAM array 100 may not be aligned to the desired magnetization direction due to back-hopping phenomenon. Under such circumstance, in the next step of the write operation, the input/output circuit 400 is configured to provide the switching pulse signal $P_3$ only to the third group of MRAM cells (the MRAM cells 64), but not to the MRAM cells 61 and 63 with proper magnetization direction in the operation unit 60.

After the input/output circuit 400 provide the switching pulse signal $P_3$ to the third group of MRAM cells in the operation unit 60 via the column decoder 300, the magnetization direction (indicated by arrow symbols) of the MTJ transistor in each MRAM cell is depicted in FIG. 7C. Since the pulse width and/or the level of the switching pulse signal $P_3$ is associated with the MRAM cells (each designated by a striped square and a numeral 64 in FIG. 6B) which require the weakest switching signal among the MRAM array 100, the MTJ transistor in each of the above-mentioned MRAM cells 64 can be aligned to a desired magnetization direction (such as horizontally towards right). Therefore, after the input/output circuit 400 sequentially provides the switching pulse signals $P_1 \sim P_3$ to the first to the third group of MRAM cells in the operation unit 60, the MTJ transistor in each MRAM cell can be aligned to a desired magnetization direction, as depicted in FIG. 7C.

The control circuit 50 is configured to generate a timing signal CLK and the voltage control signal VCS according to a mode signal MS. The timing signal CLK may include write enable signal, read enable signal, sense enable signal, and discharge signal, based on which the row select circuit 200, the column select circuit 300 and the input/output circuit 400 may perform corresponding write/read operations. The voltage generator 60 is configured to provide "N" control signals $VC_1 \sim VC_N$, based on which the input/output circuit 400 may provide the switching pulse signal $P_1 \sim P_N$, respectively.

Figure 8:
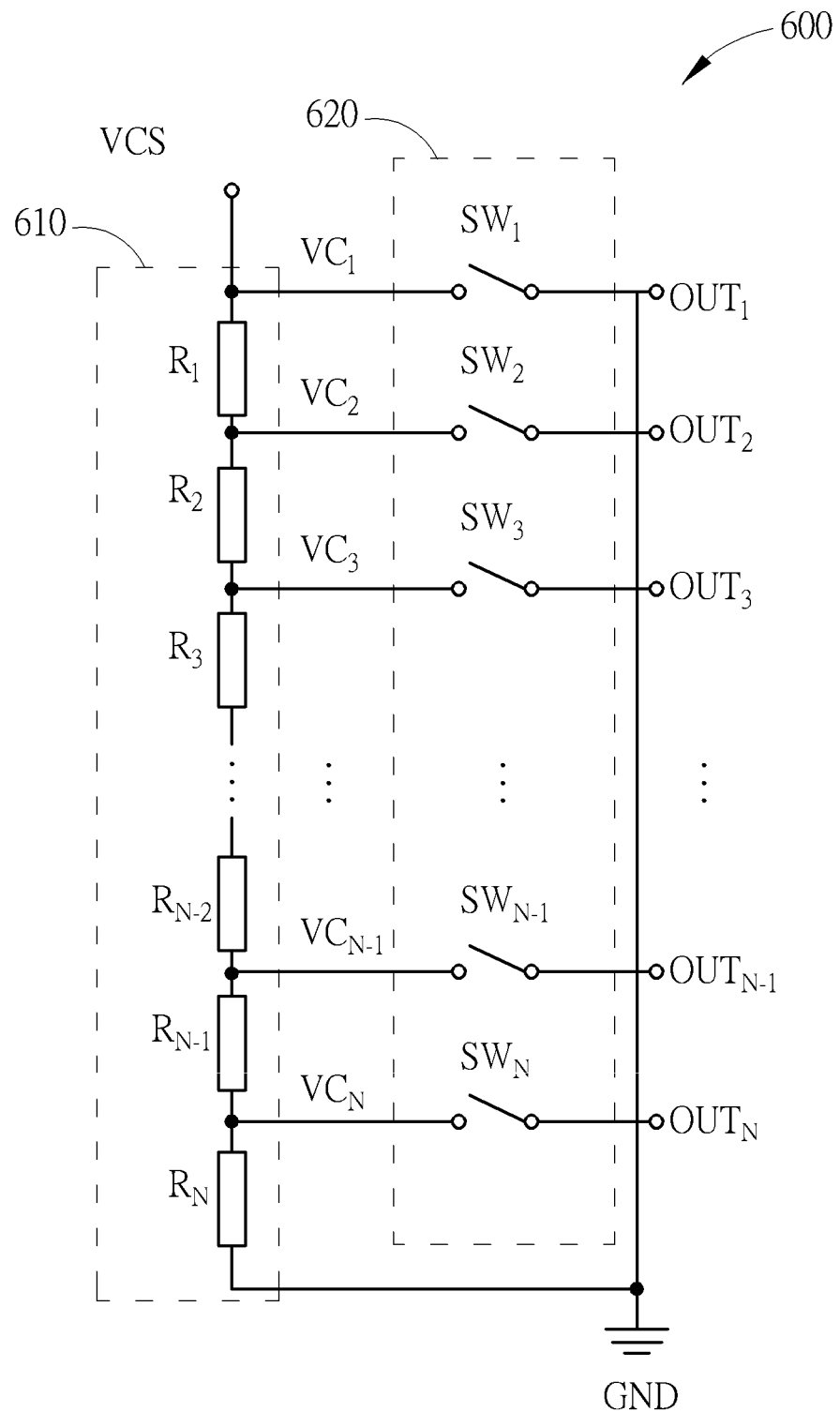
FIG. 8 is a diagram illustrating an implementation of the voltage generator according to an embodiment of the present invention.

FIG. 8 is a diagram illustrating an implementation of the voltage generator 60 according to an embodiment of the present invention. The voltage generator 60, including a voltage-dividing circuit 610 and a switch circuit 620, is configured to receive the voltage control signal VCS on an input end and provide the "N" control signals $VC_1 \sim VC_N$ on "N" output ends $OUT_1 \sim OUT_N$. The voltage-dividing circuit 610 includes "N" resistor $R_1 \sim R_N$ coupled in series between the input end of the voltage generator 600 and the ground level GND and configured to provide the "N" control signals $VC_1 \sim VC_N$ by voltage-dividing the voltage control signal VCS. The switch circuit 620 includes "N" switches $SW_1 \sim SW_N$ configured to selectively couple the "N" control signals $VC_1 \sim VC_N$ to the "N" output ends $OUT_1 \sim OUT_N$, respectively.

In the present invention, the "N" switches $SW_1 \sim SW_N$ of the switch circuit 620 may be operated by the control circuit 50, or by another device according to the timing signal. By selectively activating a specific amount of switches in the switch circuit 620, the voltage generator 600 may output a corresponding control signal. For example, when the switch $SW_1$ is activated and the switch $SW_2 \sim SW_N$ are deactivated, the voltage generator 600 may output the control signal $VC_1$, wherein $VC_1=VCS$; when the switch $SW_N$ is activated and the switch $SW_1 \sim SW_{N-1}$ are deactivated, the voltage generator 600 may output the control signal $VC_N$, wherein $VC_N=VCS*R_N/(R+R_2+ \ldots +R_N)$.

In conclusion, the STT MRAM device of the present invention includes a voltage generator configured to provide multiple control signals according to the switching characteristics of different MRAM cells. The input/output may then provide corresponding switching pulse signals to different groups of MRAM cells in each operation unit, so that the MTJ transistor in each MRAM cell may be aligned to its desired magnetization direction. Therefore, the present invention can improve back-hopping phenomenon, thereby ensuring data accuracy during the write operation of the STT MRAM device.

Those skilled in the art will readily observe that numerous modifications and alterations of the device and method may be made while retaining the teachings of the invention. Accordingly, the above disclosure should be construed as limited only by the metes and bounds of the appended claims.

What is claimed is:

1. A magnetoresistive random-access memory (MRAM), comprising:
    a memory array comprising a plurality of memory cells;
    a first operation unit comprising a first group to an $N^{th}$ groups of memory cells among the plurality of memory cells, wherein N is an integer larger than 1;
    a voltage generator comprising:
        an input end for receiving a voltage control signal;
        a plurality of output ends;
        a voltage-dividing circuit configured to provide the plurality of control signals by voltage-dividing the voltage control signal;
        a plurality of switches, wherein a first to an $N^{th}$ switches among the plurality of switches are configured to selectively couple a first to an $N^{th}$ control signals among the plurality of control signals to a first to an $N^{th}$ output ends among the plurality of output ends; and
    an input/output circuit coupled to the plurality of output ends and configured to output a first to an $N^{th}$ switching pulse signals to the first to the $N^{th}$ groups of memory cell in the first operation unit when receiving the first to the $N^{th}$ control signals, respectively, wherein the first to the $N^{th}$ switching pulse signals differ from each other in a pulse width or a level, wherein:
        a level of an $(n+1)^{th}$ switching pulse signal among the first to the $N^{th}$ switching pulse signals is narrower than a level of an $n^{th}$ switching pulse signal among the first to the $N^{th}$ switching pulse signals;
        a pulse width of an $(m+1)^{th}$ switching pulse signal among the first to the $N^{th}$ switching pulse signals is narrower than a pulse width of an $m^{th}$ switching pulse signal among the first to the $N^{th}$ switching pulse signals;
        n is an integer between 1 and N; and
        m is an integer between 1 and N.

2. The MRAM of claim 1, wherein:
    the voltage-dividing circuit includes a first to an $N^{th}$ resistors coupled in series between the input end and a ground level;
    a value of an $n^{th}$ control signal among the first to the $N^{th}$ control signals is associated with a voltage established across an $n^{th}$ to the $N^{th}$ resistors among the first to the $N^{th}$ resistors; and
    n is an integer between 1 and N.

3. The MRAM of claim 1, wherein:
    a number of memory cells in an $(n+1)^{th}$ group of memory cells among the first group to the $N^{th}$ group of memory cells does not exceed a number of memory cells in an $n^{th}$ group of memory cells among the first group to the $N^{th}$ group of memory cells; and
    n is an integer between 1 and N.

4. The MRAM of claim 1, further comprising:
    a plurality of bit lines disposed in parallel with each other; and
    a plurality of word lines disposed in parallel with each other and perpendicular to the plurality of bit lines, wherein:
        the plurality of memory cells are disposed at a plurality of intersections of the plurality of bit lines and the plurality of word lines; and
        the first group to the $N^{th}$ groups of memory cells in the first operation unit are coupled to a corresponding bit line among the plurality of bit lines or coupled to a corresponding word line among the plurality of word lines.

5. The MRAM of claim 1, further comprising:
    at least one decoder configured to determine addresses of the first group to the $N^{th}$ groups of memory cells in the first operation unit; and
    a control circuit configured to provide the voltage control signal when receiving a mode signal associated with a write operation, wherein the input/output circuit is further configured to output the first to the $N^{th}$ switching pulse signals to the first group to the $N^{th}$ groups of memory cells according to the addresses of the first group to the $N^{th}$ groups of memory cells.

6. The MRAM of claim 1, further comprising:
    a second operation unit comprising M groups of memory cells in the memory array, wherein M is an integer larger than 1, wherein:
        M switches among the plurality of switches are configured to selectively couple M control signals among the plurality of control signals to M output ends among the plurality of output ends; and
        the input/output circuit is further configured to respectively output M switching pulse signals to the M groups of memory cells in the second operation unit when receiving the M control signals.

7. The MRAM of claim 6, further comprising:
    a plurality of bit lines disposed in parallel with each other; and
    a plurality of word lines disposed in parallel with each other and perpendicular to the plurality of bit lines, wherein:
        the plurality of memory cells are disposed at a plurality of intersections of the plurality of bit lines and the plurality of word lines;
        the first group to the $N^{th}$ groups of memory cells in the first operation unit are coupled to a corresponding word line among the plurality of word lines; and
        the M groups of memory cells in the second operation unit are coupled to a corresponding bit line among the plurality of bit lines.

8. The MRAM of claim 6, further comprising:
    at least one decoder configured to determine addresses of the first group to the $N^{th}$ groups of memory cells in the first operation unit and determine addresses of the M groups of memory cells in the second operation unit; and a control circuit configured to provide the voltage control signal when receiving a mode signal associated with a write operation, wherein the input/output circuit is further configured to output the first to the $N^{th}$ switching pulse signals to the first group to the $N^{th}$ groups of memory cells in the first operation unit according to the addresses of the first group to the $N^{th}$ groups of memory cells, or output the M switching pulse signals to the M groups of memory cells in the second operation unit according to the addresses of the M groups of memory cells.

9. A magnetoresistive random-access memory (MRAM), comprising:

a memory array comprising a plurality of memory cells;

a first operation unit comprising a first group to an $N^{th}$ groups of memory cells among the plurality of memory cells, wherein N is an integer larger than 1;

a voltage generator comprising:
  an input end for receiving a voltage control signal;
  a plurality of output ends;
  a voltage-dividing circuit configured to provide the plurality of control signals by voltage-dividing the voltage control signal;
  a plurality of switches, wherein a first to an $N^{th}$ switches among the plurality of switches are configured to selectively couple a first to an $N^{th}$ control signals among the plurality of control signals to a first to an $N^{th}$ output ends among the plurality of output ends; and an input/output circuit coupled to the plurality of output ends and configured to output a first to an $N^{th}$ switching pulse signals to the first to the $N^{th}$ groups of memory cell in the first operation unit when receiving the first to the $N^{th}$ control signals, respectively, wherein the first to the $N^{th}$ switching pulse signals differ from each other in a pulse width or a level, wherein:

a number of memory cells in an $(n+1)^{th}$ group of memory cells among the first group to the $N^{th}$ group of memory cells does not exceed a number of memory cells in an $n^{th}$ group of memory cells among the first group to the $N^{th}$ group of memory cells; and n is an integer between 1 and N.

\* \* \* \* \*